United States Patent
Omole

(10) Patent No.: US 11,340,265 B2
(45) Date of Patent: May 24, 2022

(54) CIRCUIT AND METHOD FOR REAL TIME DETECTION OF A FAULTY CAPACITOR

(71) Applicant: Silego Technology Inc., Santa Clara, CA (US)

(72) Inventor: Ibiyemi Omole, Gilbert, AZ (US)

(73) Assignee: Silego Technology Inc., Santa Clara, CA (US)

( * ) Notice: Subject to any disclaimer, the term of this patent is extended or adjusted under 35 U.S.C. 154(b) by 168 days.

(21) Appl. No.: 16/590,231

(22) Filed: Oct. 1, 2019

(65) Prior Publication Data

US 2021/0096160 A1 Apr. 1, 2021

(51) Int. Cl.
*G01R 15/16* (2006.01)
*H02M 3/156* (2006.01)
*G01R 19/165* (2006.01)

(52) U.S. Cl.
CPC ........... *G01R 15/16* (2013.01); *G01R 19/165* (2013.01); *H02M 3/156* (2013.01)

(58) Field of Classification Search
CPC ..... G01R 15/16; G01R 19/165; H02M 3/156; H02M 1/32; H02M 3/07
See application file for complete search history.

(56) References Cited

U.S. PATENT DOCUMENTS

| | | | | |
|---|---|---|---|---|
| 5,608,352 A | * | 3/1997 | Itakura | H03F 1/3211 330/253 |
| 6,642,787 B1 | * | 11/2003 | Souetinov | H03F 1/3211 330/252 |
| 2006/0012336 A1 | * | 1/2006 | Fujita | H01M 10/482 320/119 |
| 2014/0043032 A1 | * | 2/2014 | Makino | G01R 31/007 324/434 |
| 2017/0299658 A1 | * | 10/2017 | Kozuka | G01R 31/3835 |
| 2021/0025941 A1 | * | 1/2021 | Shimazaki | H01M 10/4285 |

* cited by examiner

*Primary Examiner* — Akm Zakaria
(74) *Attorney, Agent, or Firm* — Saile Ackerman LLC; Stephen B. Ackerman

(57) ABSTRACT

The present document describes a detection circuit to detect a condition of a flying capacitor which is charged during a charging phase and discharged during a subsequent discharging phase. The detection circuit has a timing circuit to set a detection trigger during a charging phase of the flying capacitor, and a measurement circuit to provide one or more differential measurement signals which are dependent on and/or indicative of a voltage across the flying capacitor at the detection trigger. Furthermore, the detection circuit has a comparator circuit to provide a digital output signal based on the one or more differential measurement signals, wherein the digital output signal is indicative of whether or not the flying capacitor is faulty.

20 Claims, 7 Drawing Sheets

US 11,340,265 B2

CIRCUIT AND METHOD FOR REAL TIME DETECTION OF A FAULTY CAPACITOR

TECHNICAL FIELD

The present document relates to the real time detection of a faulty capacitor within a power converter, notably within an inductor-less DC/DC power converter.

BACKGROUND

DC/DC power converters, such as switched power converters and/or charge pumps, may comprise one or more flying capacitors on a printed circuit board, which may be faulty, notably shorted.

SUMMARY

The present document is directed at the technical problem of providing efficient and reliable means for detecting a faulty capacitor on a printed circuit board and/or within an IC package (notably without the need of a multi-meter tester).

According to an aspect, a detection circuit configured to detect a condition of a flying capacitor which is (periodically and/or repeatedly) charged during a charging phase and discharged during a subsequent discharging phase is described. The detection circuit comprises a timing circuit configured to set a detection trigger during a charging phase of the flying capacitor, and a measurement circuit configured to provide one or more differential measurement signals which are dependent on and/or which are indicative of a voltage across the flying capacitor at the (time of the) detection trigger. Furthermore, the detection circuit comprises a comparator circuit configured to provide a digital output signal based on the one or more differential measurement signals, wherein the digital output signal (which may be buffered and/or inverted) is indicative of whether or not the flying capacitor is faulty (notably shorted).

According to another aspect, a method for detecting a condition of a flying capacitor which is (periodically and/or repeatedly) charged during a charging phase and discharged during a subsequent discharging phase is described. The method comprises setting a detection trigger during a charging phase of the flying capacitor. Furthermore, the method comprises providing one or more differential measurement signals which are dependent on and/or indicative of a voltage across the flying capacitor at the and/or subsequent to detection trigger. In addition, the method comprises providing a digital output signal based on the one or more differential measurement signals, wherein the digital output signal is indicative of whether or not the flying capacitor is faulty.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings, wherein.

DESCRIPTION

Figure 1:
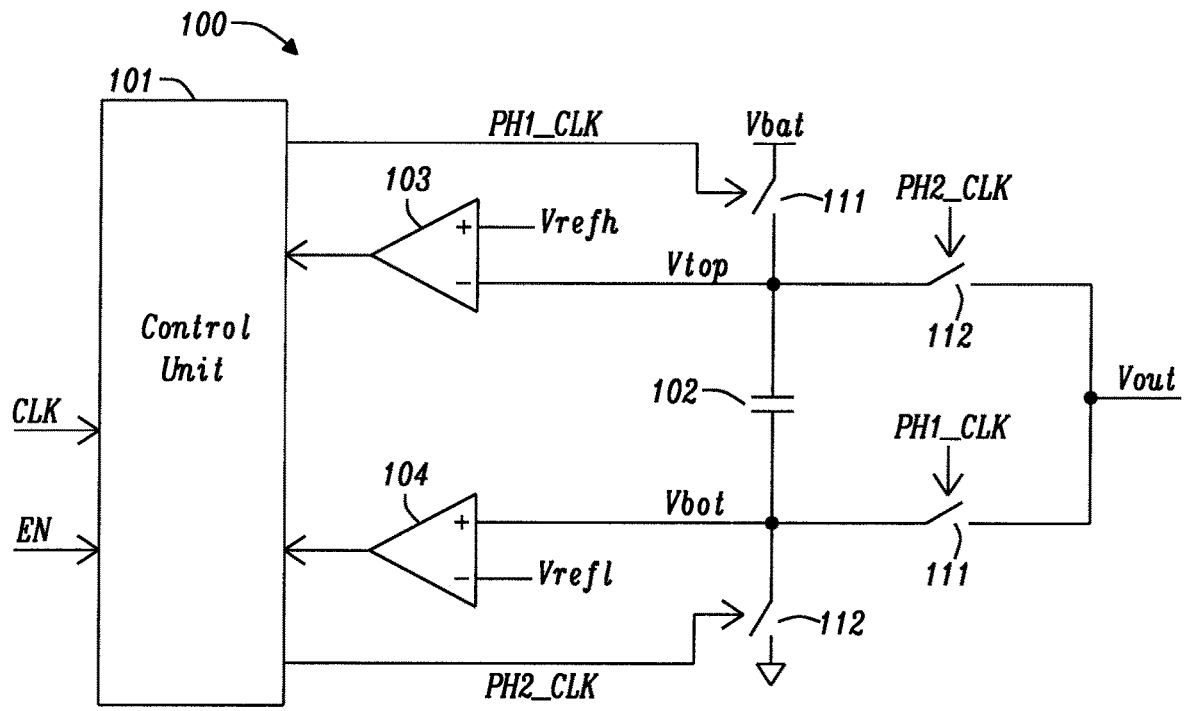
FIG. 1 illustrates an example excerpt of a power converter comprising a flying capacitor.

As indicated above, the present document is directed at detecting a faulty capacitor of a power converter, notably of an inductor-less DC/DC power converter, in an efficient and reliable manner. In particular, the present document is directed at a digital register information-based approach for flagging a fault and possibly detrimental condition within a fully integrated inductor-less DC-DC power converter, which may be integrated inside a pin/pad limited package. The fault detection method should allow for this to be performed without the requirement of an exposed pad or pin for a multi-meter test. In other words, the present document is directed at detecting a shorted capacitor condition within an integrated switched capacitor DC-DC converter comprising integrated or in-package capacitors without the need for externally exposed plates and/or terminals. This is particularly beneficial in applications which are constrained to limited pin packages with relatively small PCB (printed circuit board) footprints or for fully integrated voltage regulators (IVRs). Furthermore, the present document is directed at detecting a shorted capacitor fault condition in converters using one or more printed circuit board (PCB) mounted capacitors without an explicit or primary need of a multi-meter test.

Typically, the one or more flying capacitors of an inductor-less DC-DC converter such as a switched capacitor converter or a charge pump are placed on a PCB primarily because of the relatively large capacitor value of the one or more capacitors. Integration of a capacitor typically leads to a relatively large die area and to relatively high cost. The cost further increases if a dual die approach is used, where a bonded die may be dedicated to an integrated capacitor in order to achieve a relatively large capacitance value.

The inherent disadvantages of using on-board (PCB) capacitors involve system test costs and disadvantages which include:

Printed circuit board (PCB) real estate consumption by a mounted capacitor.

Multi-meter test equipment needed for pin test.

Not easily or readily usable for pin limited small form factor packages.

The use of exposed pads for capacitor terminal access.

External multi-meter test requirements.

Typically, during testing, the device-under-test (DUT) is subjected to a multi-meter test in a laboratory to determine a shorted capacitor fault condition; a condition which could arise due to a capacitor with a deteriorated dielectric; a circuit net short or a capacitor terminals solder short during device life time operation or during the soldering process.

The emerging trend in portable computing power management is moving towards fully integrated or system-in-package (SiP) voltage regulators and/or converters, in order to reduce system PCB area and system bill of material (BOM) cost, and in order to establish relatively fast dynamic voltage scaling (DVS) performance in response to CPU/GPU (Central Processing Unit/Graphical Processing Unit) power saving needs.

Such fully integrated power modules may employ multi-stage converters which may comprise a combination of an inductor-based or inductor-less first stage converter followed by an inductor-based multi-phase second stage DC-DC converter which may operate at switching frequencies in the range of high tens to hundreds of megahertz (MHz).

Load current capability of a power converter is an important factor such that for relatively low load current power delivery, a combination of an inductor-less first stage followed by an inductor-based second stage may be sufficient, while for relatively high load current power delivery, a combination of an inductor-based first and second stage working in tandem may be used.

In this context, means for detecting a shorted capacitor in a fully integrated or an in-package inductor-less DC-DC converter, notably within a switched-capacitor converter or a charge pump, without exposed pads for the capacitor terminals or with limited pin-count and small form factor package, is desirable.

FIG. 1 shows an example circuit 100 used within a half ratio switched capacitor step-down converter. The circuit 100 comprises a flying capacitor 102 which may be coupled in a first phase PH1 between Vbat (i.e. the battery voltage) and Vout (i.e. the output voltage) by closing the first switches 111 (and by opening the second switches 112). As a result of this, during the first phase PH1 (i.e. the charging phase) the voltage Vtop at the top terminal of the flying capacitor 102 is Vtop=~Vbat (accounting for the likely voltage drop at the switch 111), and the voltage Vbot at the bottom terminal of the flying capacitor 102 is Vbot=~Vout. In a second phase PH2 (i.e. the discharging phase) the first switches 111 are open and the second switches 112 are closed, thereby coupling the flying capacitor 102 between the output voltage Vout (such that Vtop=~Vout) and ground (such that Vbot=~GND).

The first switches 111 are controlled using the first control signals PH1_CLK, and the second switches are controlled using the second control signals PH2_CLK. The first and second control signals are determined using the top comparator 103 and the bottom comparator 104, wherein the top comparator 103 is configured to compare Vtop with a top reference voltage Vrefh, and wherein the bottom comparator 104 is configured to compare Vbot with a bottom reference voltage Vrefl. The output of the comparators 103, 104 is used within a control unit 101 to generate the first and second control signals (under consideration of a clock signals CLK and an enable signal EN).

Figure 2A:
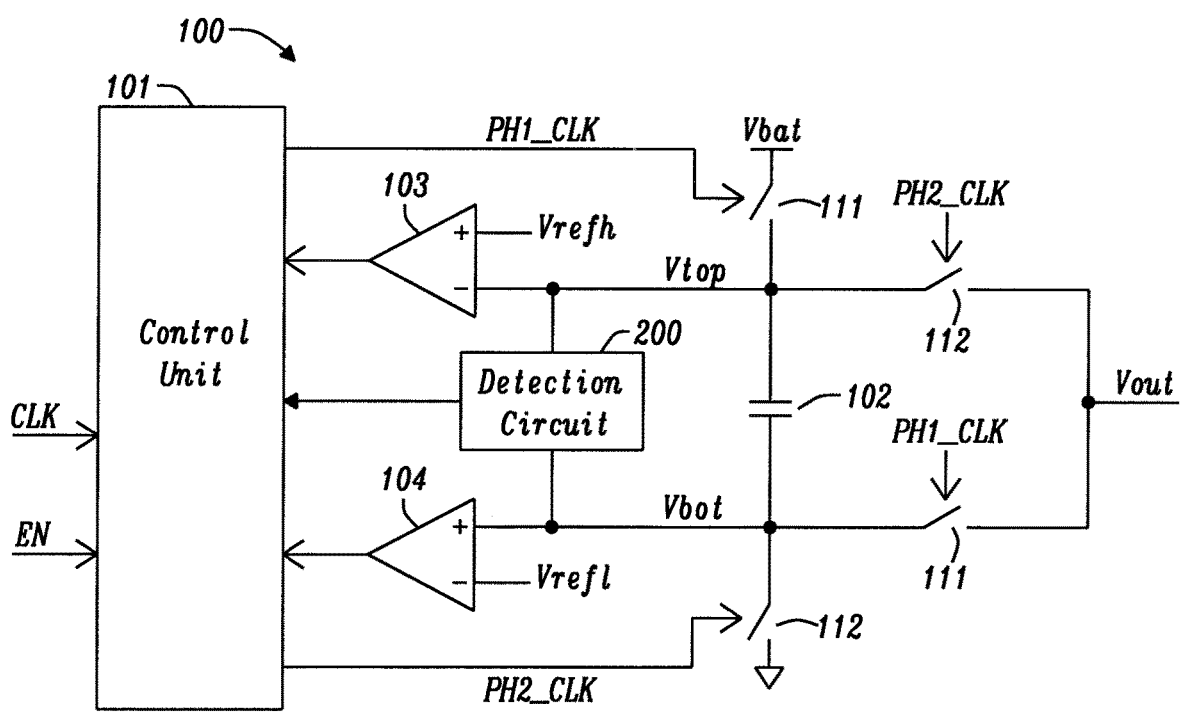
FIG. 2A shows the control circuit of FIG. 1 comprising a detection circuit.

FIG. 2A shows the circuit 100 of FIG. 1 with an additional detection circuit 200 configured to determine the condition of the flying capacitor 102. The detection circuit 200 receives as inputs (only) the top voltage Vtop at the top terminal and the bottom voltage Vbot at the bottom terminal of the flying capacitor 102. As indicated above, in case of a non-faulty flying capacitor 102, the following conditions should be met:

Vtop=~Vbat, and Vbot=~Vout, during the first phase; and
Vtop=~Vout, and Vbot=~GND, during the second phase;

wherein the flying capacitor 102 is charged with an electrical charge during the first phase and discharged during the second phase. During operation of the power converter, the output voltage is typically set to be half the battery voltage, i.e. Vout=Vbat/2, in the particular converter configuration shown in FIG. 2a.

Figure 2B:
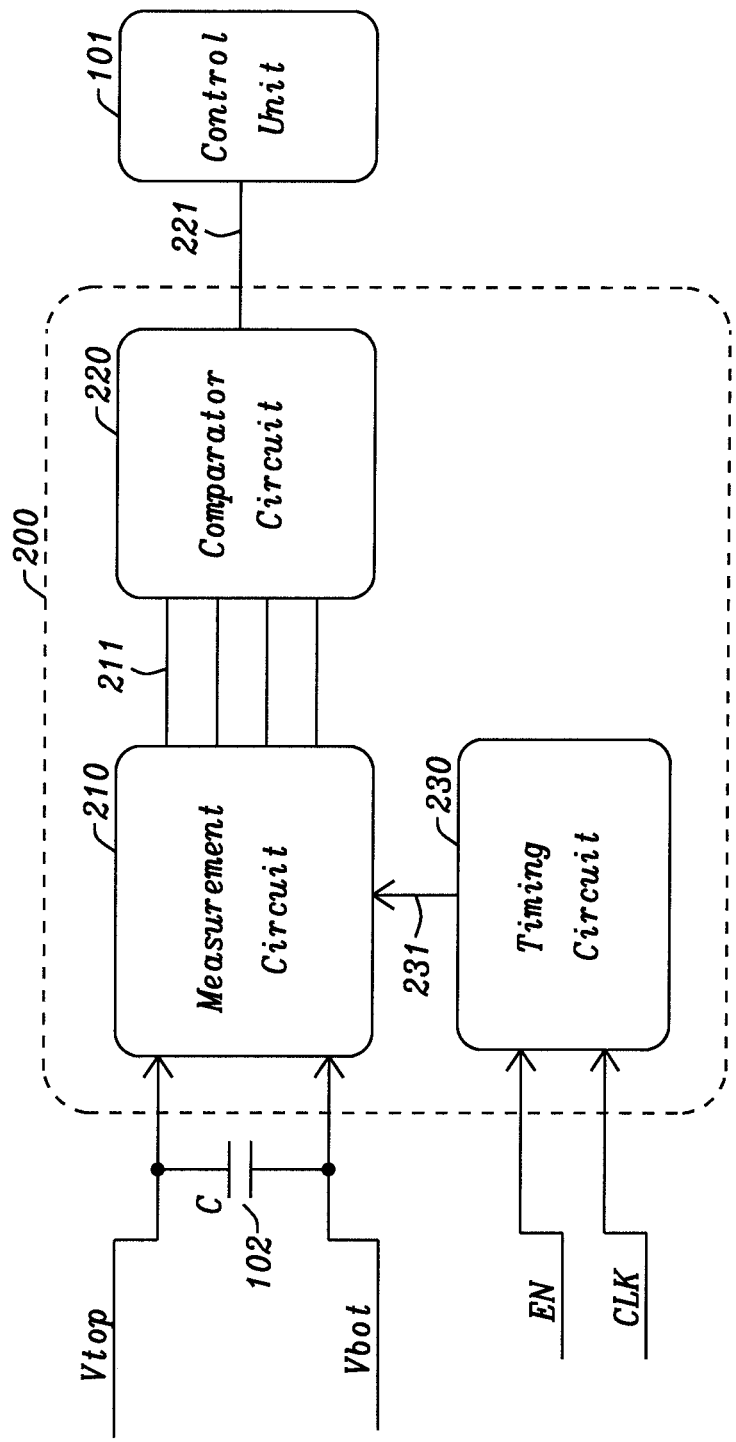
FIG. 2B shows a block diagram of an example detection circuit.

FIG. 2B shows a block diagram of an example detection circuit 200. The detection circuit 200 comprises an N-stage counter (i.e. a timing circuit) 230 which is configured to generate a detection trigger 213 in dependence of the enable signal EN and the clock signal CLK. The detection trigger 213 may be set to N clock cycles subsequent to the beginning of the first phase (with e.g. N=8 or more). N may be sufficiently high to allow the flying capacitor 102 to be charged with an electrical charge $\Delta Q$ (such that the voltage across the flying capacitor 102 is at or above a minimum capacitor voltage).

Once, the electrical charge $\Delta Q$ has been built up on the flying capacitor 102, the detection trigger 213 may be set, in order to initiate operation of a measurement circuit 210 which is configured to provide multiple differential measurement signals 211. The measurement signals 211 may be analyzed and/or compared within a comparator circuit 220, in order to provide an output signal 211 that is indicative of whether the flying capacitor 102 is faulty or not.

Figure 3:
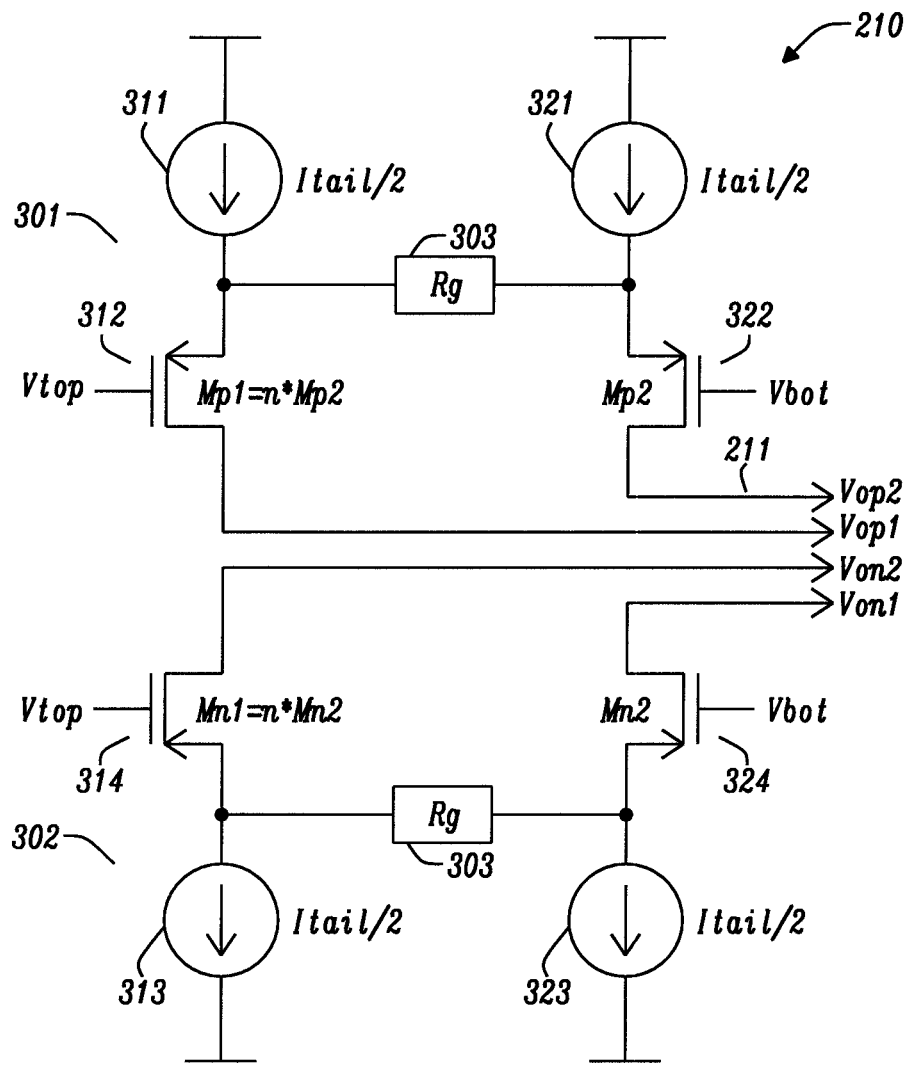
FIG. 3 shows a circuit diagram of an example measurement circuit.

FIG. 3 shows a circuit diagram of an example measurement circuit 210. The measurement circuit 210 comprises a first (upper) differential pair 301 which is configured to provide the differential measurement signal Vop1 and Vop2. The first differential pair 301 operates relative to the battery voltage Vbat. Furthermore, the measurement circuit 210 comprises a second (lower) differential pair 302 which is configured to provide the differential measurement signal Von1 and Von2. The second differential pair 302 operates relative to ground GND.

Each differential pair 301, 302 comprises a first branch with a first current source 311, 313 which is configured to provide a current Itail/2 on the first branch, and a second branch with a second current source 321, 323 which is configured to provide a current Itail/2 on the second branch. The current on the first branch is provided to a first transistor Mp1 312 or Mn1 314, and the current on the second branch is provided to a second transistor Mp2 322 or Mn2 324, wherein the transistors are controlled using the top voltage Vtop (in case of the first branch) or the bottom voltage Vbot (in case of the second branch). The first and the second branch of a differential pair 301, 302 are coupled via an offset or degradation resistance Rg 303.

If the flying capacitor 102 works correctly, Vtop should be higher than Vbot, i.e. Vtop>Vbot, subsequent to build up of the electrical charge $\Delta Q$ over the time period $\Delta t$. Furthermore, the difference voltage (Vbat-Vtop) should be smaller than the difference voltage (Vbot-GND), for instance in a normal charging phase. As a result of this, for the first differential pair 301 Vop2>Vop1, and for the second differential pair 302 Von2<Von1.

On the other hand, the flying capacitor 102 may be shorted, such that Vtop=Vbot=Vbat. In this case, the first differential pair 301 turns off (such that Vop2~Vop1), while for the second differential pair 302 Von2>Von1.

Figure 4A:
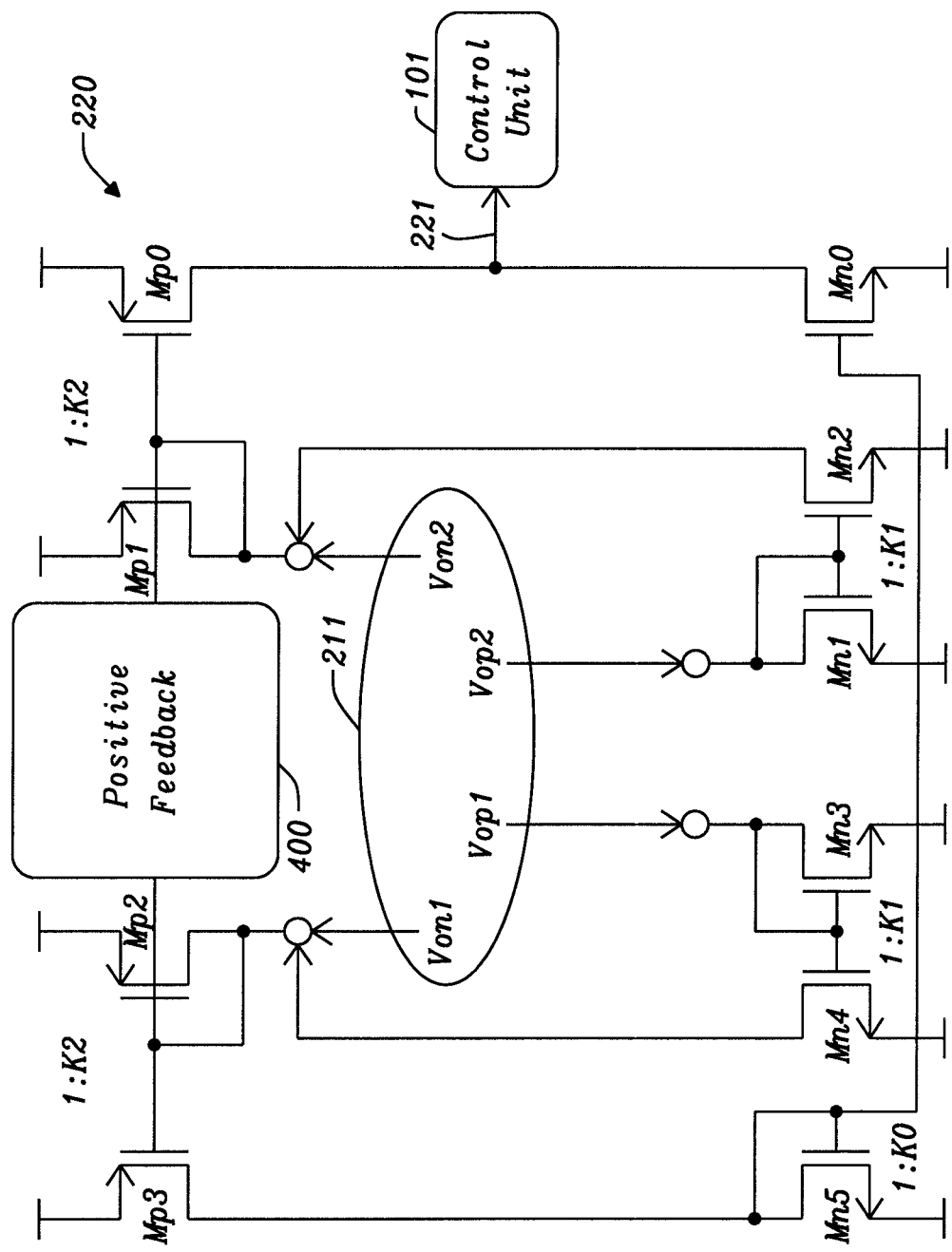
FIGS. 4A and 4B show circuit diagrams of an example comparator circuit.
Figure 4B:
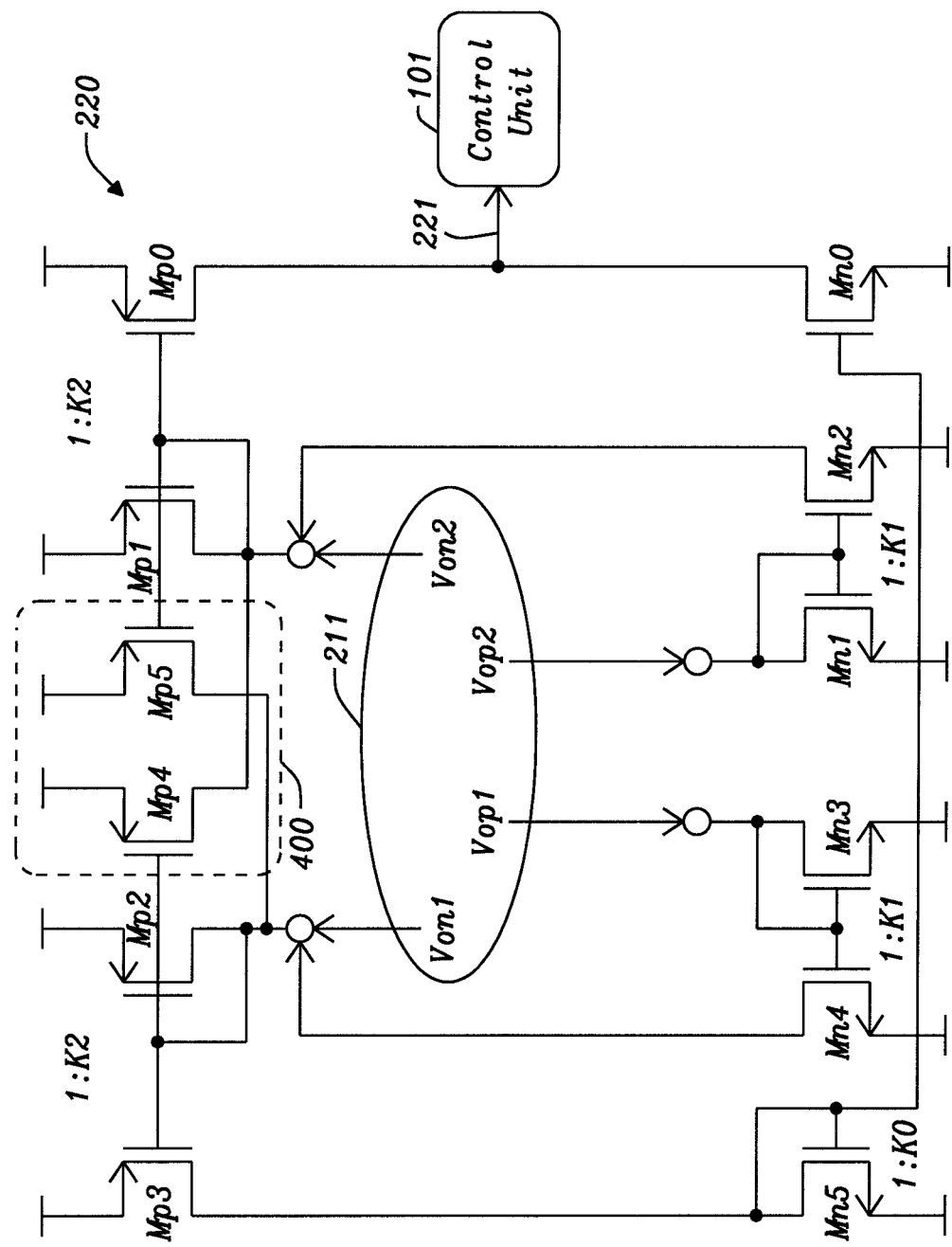

FIGS. 4A and 4B show example comparator circuits 220 which are configured to analyze the differential measurements signals 211, in order to provide a (binary) output signal 221 which is indicative of whether the flying capacitor 102 is faulty or whether the flying capacitor 102 working correctly.

Hence, a skewed voltage comparator 210, 220 and digital memory 101, which can be easily integrated as a detector for capacitor short-circuit fault conditions in an inductor-less DC-DC converter, are described. By doing this, exposed pins and pads counts may be reduced, in order to allow for small form factor package applications.

A rail-to-rail voltage comparator with skewed complementary differential pair input is placed across the embedded capacitor plates within the inductor-less DC-DC converter, such as a switched-capacitor down converter or charge pump.

FIG. 2B shows a representative functional block diagram of the short circuit fault detector 200. The N-stage counter 230 (such as a ripple counter or another digital counter variant) senses the start of the converter clock CLK and allows for a relatively small time delay of $\Delta t$ (which can be determined a priori in dependence of the typical capacitance value of the flying capacitor 102) from the initial start time t1 of the converter clock CLK to the detection trigger time t2. The time delay $\Delta t$ is selected to be sufficiently long to over-drive the differential pair above the voltage given by the product of Itail/2 (differential pair tail current) and Rg (nominal degeneration resistance value).

The $\Delta t$ time period is used to ensure a reliable detection of a faulty capacitor (during a charging phase of the flying capacitor 102). In particular, the $\Delta t$ time period is used to build up a certain amount of charge $\Delta Q$ (equal to the product of the capacitance C and $\Delta V$ to build up over time $\Delta t$) to be stored on the capacitor 102 from its initial charge condition Q0 (which could possibly be zero).

Hence, if the capacitor 102 is not faulty or shorted, a charge amount $\Delta Q$ is stored on the capacitor 102, wherein the charge $\Delta Q$ is high enough to allow the degenerated side of a differential pair 301, 302 to overcome the inherent systematic offset (Vgs imbalance) and a voltage drop on the degeneration resistor Rg 303 (since the voltage difference $\Delta V = \Delta Q/C = Ic*\Delta t/C$ across the capacitor 102 is sufficiently high, i.e. greater than 0.5*Itail*Rg) such that once detection is triggered by the counter 230, the buffered and/or inverted digital output 221 remains in LOW digital state if no short exists.

However, if the capacitor 102 is faulty or shorted, then even after the time period $\Delta t$ has elapsed, no charge or only little charge is stored on the capacitor 102, which leads to a situation where the voltage difference across the capacitor plates $\Delta V = Vtop - Vbot$ is not high enough to overcome the inherent systematic offset since it approaches zero, i.e. $\Delta V = Vtop - Vbot = \Delta Q/C << 0.5*Itail*Rg$. As a result of this, the shorted capacitor fault detection signals a HIGH digital output signal 221 to the storage register or digital memory or control unit 101. The control unit 101 may then control the circuit 100 in dependence of the state of the digital output signal 221. By way of example, operation of the switches 111, 112 may be stopped, if the digital output signal 221 indicates a faulty capacitor 102.

In the measurement circuit 210 shown in FIG. 3, the transconductance of one of the input pair devices in each complementary differential pair 301, 302 may intentionally be mis-matched to its own pair using a source degeneration concept, where in the diagram "n" may be greater than or equal to 1. Source degeneration of one side of each input differential pair 301, 302 may be used to ensure that at the same common-mode voltage level (i.e. the voltage across the capacitor 102 $\Delta V = 0$ or approaching 0V), the none-degenerated input device always wins the analog competition at the common-tail current node.

The positive feedback 400 in the signal combiner and comparator circuit 220 shown in FIGS. 4A and 4B inherently introduces a relatively large gain to further enhance a current flow imbalance in the differential pairs load devices, thereby leading to an inherent offset (in mV range) that must be overcome by the differential measurements signals 211 from the differential pairs devices before the comparator output 221 can change direction. This inherently ensures that the comparator circuit 220 can generate a reliable analog difference signal which is amplified to the digital level output flag 221, once it senses the input common-mode voltage approaching zero, which is the situation when the converter capacitor terminals become shorted.

The signal output 221 of the complementary differential pairs 301, 302 can then be amplified using one or more mechanisms including an open-loop analog gain stage and/or a regenerative latch stage, in order to produce the CMOS digital level signal 221 that can be stored in a digital register and read out as often as desired in an application in order to monitor the health of the converter capacitor 102.

Figure 5:
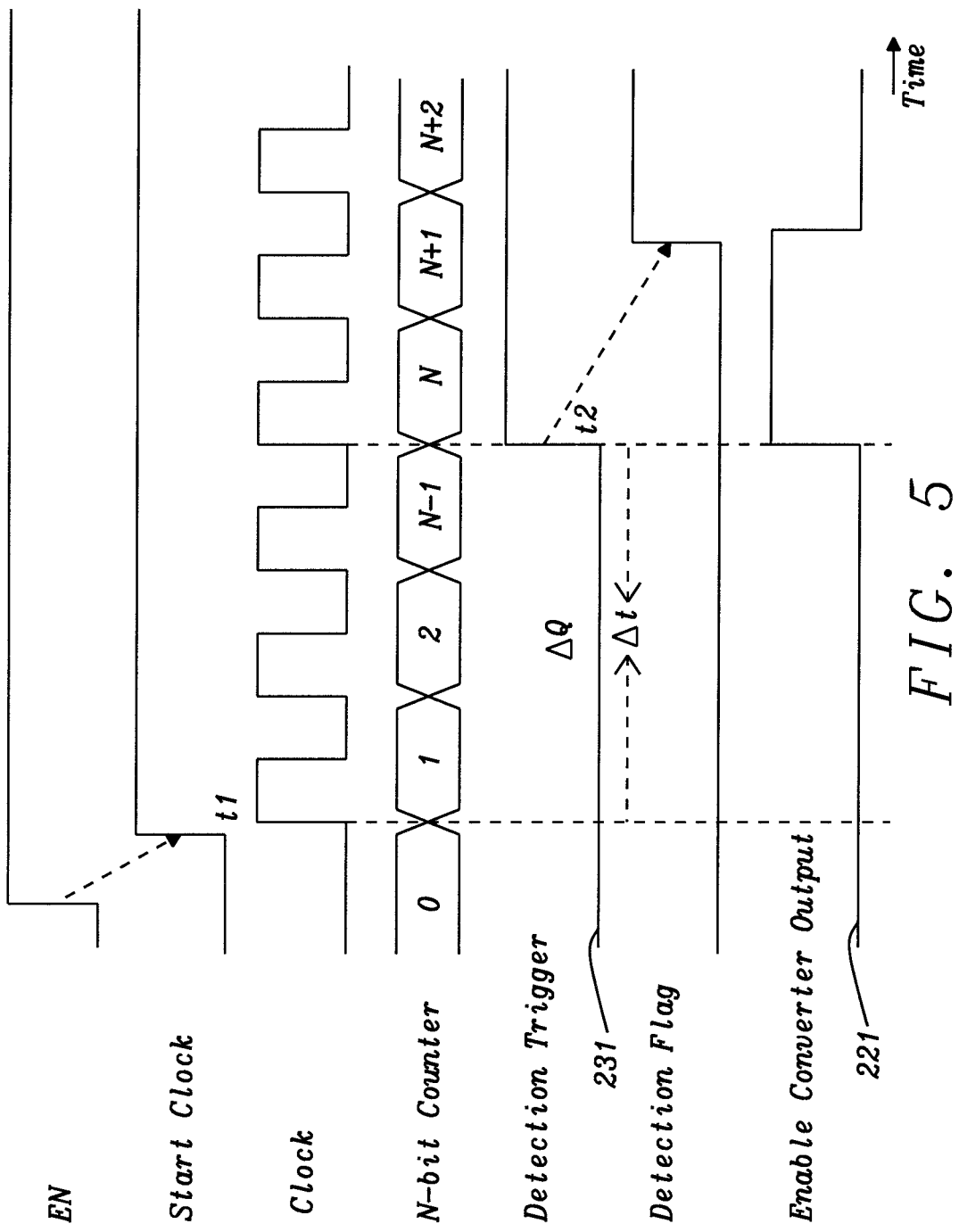
FIG. 5 shows an example timing diagram.

FIG. 5 shows an example timing diagram. It can be seen that subsequent to activation of the enable signal EN, the clock starts at time instant t1 and the N-bit counter 230 counts up $2^N$ clock cycles which correspond to the time period $\Delta t$, wherein this time period lead to a charge $\Delta Q$ on the capacitor 102 (if the capacitor 102 is working correctly). The detection trigger 213 is set subsequent to the time period $\Delta t$, thereby initiating a measurement at time instant t2. The detection circuit 200 requires a certain time for converging and for providing the output signal 221 which indicates the condition of the capacitor 102. In the illustrated example, the capacitor 102 is faulty, thereby setting the detection flag to HIGH.

Hence, the present document describes a detection circuit 200 configured to detect a condition of a flying capacitor 102 which is (periodically and/or repeatedly) charged during a charging phase and discharged during a subsequent discharging phase. The charging phase and the discharging phase may be repeated at a certain rate controlled by a clock signal CLK. The flying capacitor 102 may be part of an inductor-less DC/DC power converter 100 configured to convert power from a supply (or battery) voltage Vbat to an output voltage Vout. During the charging phase the flying capacitor 102 may be arranged (directly) between a supply voltage Vbat and the output voltage Vout of the circuit 100 (e.g. the power converter) comprising the flying capacitor 102. The supply voltage Vbat may be higher than the output voltage Vout, e.g. Vout=Vbat/2 (at least in average).

The detection circuit 200 may comprise a timing circuit 230 which is configured to set a detection trigger 213 during a charging phase (notably during each or every $k^{th}$ charging phase, with k=1, 2, 3, 4, 5, 10, or more) of the flying capacitor 102. Hence, the condition of the flying capacitor 102 may be determined during every $k^{th}$ charging phase. The detection trigger 213 may be determined using the clock signal CLK. In particular, the detection trigger 213 may be N times the duration of a clock cycle.

Furthermore, the detection circuit 200 comprises a measurement circuit 210 configured to provide one or more differential measurement signals 211 which are dependent on and/or indicative of the voltage across the flying capacitor 102 at the or subsequent to the detection trigger 213 (i.e. at the time instant of the detection trigger 213). The timing circuit 230 may be configured to set the detection trigger 213 such that in case of a non-faulty flying capacitor 102 the voltage across the flying capacitor 102 is at a minimum capacitor voltage or higher. Hence, the detection trigger 213 may be dependent on the capacitance value of the flying capacitor 102. The minimum capacitor voltage is preferably high enough to cause the measurement circuit 210 to provide a differential measurement signal 211 sufficiently high to indicate a non-faulty flying capacitor 102.

In addition, the detection circuit 200 comprises a comparator circuit 220 configured to provide a digital output signal 221 based on the one or more differential measurement signals 211. The (buffered and/or inverted) digital output signal 221 may be indicative of whether or not the flying capacitor 102 is faulty (e.g. shorted). The detection circuit 200 may comprise a register and/or memory configured to store the digital output signal 221.

Hence, a precise and reliable detection circuit 200 may be provided, which may be integrated inside a chip soldered onto the PCB of the flying capacitor 102 without the need of providing additional pins, thereby enabling a cost-efficient integration of the detection circuit 200.

The flying capacitor 102 may exhibit a top voltage Vtop at a top terminal and a bottom voltage Vbot at a bottom terminal of the flying capacitor 102. During the charging phase the top voltage Vtop may be higher than the bottom voltage Vbot in case of a non-faulty flying capacitor 102. Hence, the voltage across the flying capacitor 102 may be positive. The measurement circuit 210 may be configured to provide one or more differential measurement signals 211 which are indicative of whether or not the top voltage Vtop is higher than the bottom voltage Vbot, or whether the top voltage Vtop and the bottom voltage Vbot are substantially equal. As a result of this, the condition of the flying capacitor 102 may be determined in a reliable manner.

The measurement circuit 210 may comprise at least one differential pair 301, 302 which comprises a first (MOS, metal-oxide semiconductor) transistor 312, 314 on the branch that is controlled using the top voltage Vtop and a second transistor 322, 324 on the branch that is controlled using the bottom voltage Vbot. A differential measurement signal 211 which is provided by the measurement circuit 210 may comprises a component Vop1, Von2 indicative of an output voltage on the branch that is controlled by the top voltage Vtop and a component Vop2, Von1 indicative of an output voltage on the branch that is controlled by the bottom voltage Vbot of the at least one differential pair 301, 302. The digital output signal 221 may be determined in a reliable manner based on the first components Vop1, Von1 and based on the second components Vop2, Von2.

The at least one differential pair 301, 302 may comprise a degeneration resistor 303 arranged (directly) between the source of the first transistor 312, 314 and the source of the second transistor 322, 324. The detection trigger 213 may be set such that in case of a non-faulty flying capacitor 102 the voltage across the flying capacitor 102 is equal to or greater than the voltage across the degeneration resistor 303 (at the time instant of the detection trigger 213).

The at least one differential pair 301, 302 typically comprises a current source 311, 321, 313, 323 which is configured to provide a branch current |Itail/2 (e.g. half of a bias current Itail of the differential pair 301, 302) on the branch that is controlled by the top voltage Vtop and on the branch that is controlled by the bottom voltage Vbot. The detection trigger 213 may be set such that in case of a non-faulty flying capacitor 102 the voltage across the flying capacitor 102 is equal to or greater than the branch current times a resistance value of the degeneration resistor 303. Furthermore, the detection trigger 213 may be set such that in case of a faulty flying capacitor 102 the voltage across the flying capacitor 102 is smaller than the branch current times a resistance value of the degeneration resistor 303.

By making use of a degeneration resistor, the two conditions "faulty" and "non-faulty" flying capacitor 102 may be detected in a particularly reliable manner.

The measurement circuit 210 may comprise an upper differential pair 301, notably a PMOS differential pair, which is arranged relative to the battery voltage Vbat used for operating the flying capacitor 102, and which is configured to provide an upper differential measurement signal 211. Furthermore, the measurement circuit 210 may comprise a lower differential pair 302, notably a NMOS differential pair, which is arranged relative to ground GND used for operating the flying capacitor 102, and which is configured to provide a lower differential measurement signal 211. The digital output signal 221 may be determined in a particularly reliable manner based on the upper differential measurement signal 211 and based on the lower differential measurement signal 211.

The upper differential pair 301 may comprise a current source 311, 321 providing a bias current Itail from a supply rail at the battery voltage Vbat. Furthermore, the upper differential pair 301 may comprise a first PMOS transistor 312 on the branch which is controlled using the top voltage Vtop, and a second PMOS transistor 322 on the branch which is controlled using the bottom voltage Vbot. In addition, the upper differential pair 301 may comprise a degeneration resistor 303 arranged (directly) between the source of the first PMOS transistor 312 and the source of the second PMOS transistor 322. The first component Vop1 of the upper differential measurement signal 211 may be provided (directly) at the drain of the first PMOS transistor 312, and the second component Vop2 of the upper differential measurement signal 211 may be provided (directly) at the drain of the second PMOS transistor 322.

In a complementary manner, the lower differential pair 302 may comprise a current source 313, 323 providing a bias current Itail from a ground rail at ground GND. Furthermore, the lower differential pair 302 may comprise a first NMOS transistor 314 on the branch which is controlled using the top voltage Vtop, and a second NMOS transistor 324 on the branch which is controlled using the bottom voltage Vbot. In addition, the lower differential pair 302 may comprise a degeneration resistor 303 arranged (directly) between the source of the first NMOS transistor 314 and the source of the second NMOS transistor 324. The first component Von1 of the lower differential measurement signal 211 may be provided (directly) at the drain of the second NMOS transistor 324, and/or the second component Von2 of the lower differential measurement signal 211 may be provided (directly) at the drain of the first NMOS transistor 314.

The comparator circuit 220 may comprise a first combiner circuit configured to combine the first component Vop1 of the upper differential measurement signal 211 with the first component Von1 of the lower differential measurement signal 211, to provide a first combined component. Furthermore, the comparator circuit 220 may comprise a second combiner circuit configured to combine the second component Vop2 of the upper differential measurement signal 211 with the second component Von2 of the lower differential measurement signal 211, to provide a second combined component. The first combiner circuit and/or the second combiner circuit may each comprise one or more current mirrors.

The comparator circuit may be configured to determine the digital output signal 221 based on the first combined component and based on the second combined component, notably by comparing the first combined component and the second combined component. By doing this, the digital output signal may be determined in a particularly reliable manner.

As indicated above, a differential measurement signal 211 which is provided by the measurement circuit 210 may comprise a first component Vop1, Von1 and a second component Vop2, Von2. The measurement circuit 210 may be configured to generate the differential measurement signal 211 such that the first component Vop1, Von1 is smaller than the second component Vop2, Von2, if the voltage across the flying capacitor 102 is greater than a voltage threshold; or the first component Vop1, Von1 is greater than the second component Vop2, Von2, if the voltage across the flying capacitor 102 is greater than the voltage threshold; and/or the first component Vop1, Von1 is greater than the second component Vop2, Von2, if the voltage across the flying capacitor 102 is smaller than the voltage threshold; or the first component Vop1, Von1 is smaller than the second component Vop2, Von2, if the voltage across the flying capacitor 102 is smaller than the voltage threshold.

In particular, the upper differential pair 301 of the measurement circuit 210 may be configured to generate the differential measurement signal 211 such that the first component Vop1 is smaller than the second component Vop2, if the voltage across the flying capacitor 102 is greater than the voltage threshold.

Alternatively, or in addition, the lower differential pair 302 of the measurement circuit 210 may be configured to generate the differential measurement signal 211 such that the first component Von1 is greater than the second component Von2, if the voltage across the flying capacitor 102 is greater than a voltage threshold; and/or the first component Von1 is smaller than the second component Von2, if the voltage across the flying capacitor 102 is smaller than the voltage threshold.

The comparator circuit 220 may be configured to compare the first component Vop1, Von1 with the second component Vop2, Von2 (or signals derived therefrom) in order to determine the digital output signal 221. By doing this, the condition of the flying capacitor 102 may be determined in a reliable manner.

The comparator circuit 220 may comprise a first amplifier configured to amplify the first component Vop1, Von1 (or a signal derived therefrom) of the differential measurement signal 211, to provide a first amplified component. Furthermore, the comparator circuit 220 may comprise a second amplifier configured to amplify the second component Vop2, Von2 of the differential measurement signal 211, to provide a second amplified component. The first amplifier and/or the second amplifier may each comprise one or more NMOS or PMOS current mirrors.

Furthermore, the comparator circuit 220 may be configured to compare the first amplified component with the second amplified component in order to determine the digital output signal 221. By doing this, the reliability for determining the condition of the flying capacitor 102 may be further increased.

The comparator circuit 220 may comprise positive feedback circuitry 200 configured to feedback a signal derived from the first component Vop1, Von1 to the second amplifier; and/or to feedback a signal derived from the second component Vop2, Von2 to the first amplifier, thereby further increasing the sensitivity of the detection circuit 200.

Furthermore, a control circuit 100 for operating a flying capacitor 102 is described. The control circuit 100 comprises one or more switches 111, 112 configured to operate the flying capacitor 102 repeatedly in a charging phase and in a discharging phase. Furthermore, the control circuit comprises the detection circuit 200 which is described in the present document and which is configured to determine a digital output signal 221 during a charging phase, wherein the digital output signal 221 is indicative of whether the flying capacitor 102 is faulty (e.g. shorted) or not. In addition, the control circuit 100 comprises a control unit 101 which is configured to control the one or more switches 111, 112 in dependence of the digital output signal 221.

Figure 6:
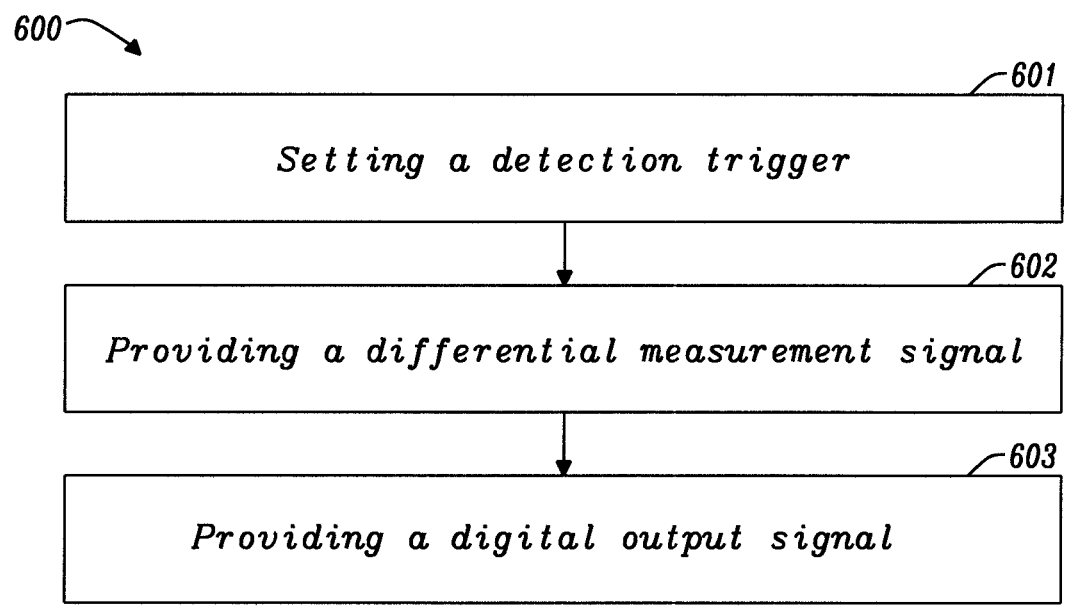
FIG. 6 shows a flow chart of an example method for detecting a faulty capacitor.

FIG. 6 shows a flow chart of an example method 600 for detecting a condition of a flying capacitor 102 which is (periodically and/or repeatedly) charged during a charging phase and discharged during a subsequent discharging phase. The method 600 comprises setting 601 a detection trigger 213 during a charging phase of the flying capacitor 102. Furthermore, the method 600 comprises providing 602 one or more differential measurement signals 211 which are dependent on and/or indicative of a voltage across the flying capacitor 102 at the detection trigger 213. In addition, the method 600 comprises providing 603 a digital output signal 221 based on the one or more differential measurement signals 211, wherein the digital output signal 221 is indicative of whether or not the flying capacitor 102 is faulty.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A detection circuit configured to detect a condition of a flying capacitor which is charged during a charging phase and discharged during a subsequent discharging phase; wherein the detection circuit comprises a timing circuit configured to set a detection trigger during the charging phase of the flying capacitor;

a measurement circuit configured to provide one or more differential measurement signals which are dependent on and/or indicative of a voltage across the flying capacitor at the detection trigger; and a comparator circuit configured to provide a digital output signal based on the one or more differential measurement signals; wherein the digital output signal is indicative of whether or not the flying capacitor is faulty;

wherein the flying capacitor exhibits a top voltage at a top terminal and a bottom voltage at a bottom terminal of the flying capacitor, during the charging phase the too voltage is higher than the bottom voltage in case of a non-faulty flying capacitor, the measurement circuit is configured to provide the one or more differential measurement signals which are indicative of whether or not the too voltage is higher than the bottom voltage;

the measurement circuit comprises at least one differential pair which comprises a first transistor on a first branch that is controlled using the top voltage and a second transistor on a second branch that is controlled using the bottom voltage;

a differential measurement signal comprises a component Indicative of an output voltage on the first branch that is controlled using the top voltage and a component indicative of an output voltage on the second branch that Is controlled using the bottom voltage of the at least one differential pair;

the measurement circuit comprises an upper differential pair, which is arranged relative to a battery voltage used for operating the flying capacitor, and which is configured to provide an upper differential measurement signal;

the measurement circuit comprises a lower differential pair, which is arranged relative to a ground used for operating the flying capacitor, and which is configured to provide a lower differential measurement signal;

the upper differential pair comprises a current source providing a bias current from a supply rail at the battery voltage;

the upper differential pair comprises a first PMOS transistor on the first branch which is controlled using the too voltage;

the upper differential pair comprises a second PMOS transistor on the second branch which is controlled using the bottom voltage;

the upper differential pair comprises a degeneration resistor arranged between a source of the first PMOS transistor and a source of the second PMOS transistor;

a first component of the upper differential measurement signal is provided at a drain of the first PMOS transistor, and a second component of the upper differential measurement signal is provided at a drain of the second PMOS transistor.

2. The detection circuit of claim 1, wherein the at least one differential pair comprises a degeneration resistor arranged between a source of the first transistor and a source of the second transistor.

3. The detection circuit of claim 2, wherein the at least one differential pair comprises a current source configured to provide a branch current on the first branch that is controlled using the top voltage and on the second branch that is controlled using the bottom voltage; and the detection trigger is such that in case of a non-faulty flying capacitor the voltage across the flying capacitor is equal to or greater than a voltage across the degeneration resistor; and/or the detection trigger is such that in case of a faulty flying capacitor the voltage across the flying capacitor is smaller than the branch current times a resistance value of the degeneration resistor.

4. A detection circuit configured to detect a condition of a flying capacitor which is charged during a charging phase and discharged during a subsequent discharging phase; wherein the detection circuit comprises a timing circuit configured to set a detection trigger during the charging phase of the flying capacitor;

a measurement circuit configured to provide one or more differential measurement signals which are dependent on and/or Inchoative of a voltage across the flying capacitor at the detection trigger; and comparator circuit configured to provide a digital output signal based on the one or more differential measurement signals; wherein the digital output signal is indicative of whether or not the flying capacitor is faulty;

wherein the flying capacitor exhibits a top voltage at a top terminal and a bottom voltage at a bottom terminal of the flying capacitor;

during the charging phase the top voltage is higher than the bottom voltage in case of a non-faulty flying capacitor;

the measurement circuit is configured to provide the one or more differential measurement signal which are indicative of whether or not the top voltage is higher than the bottom voltage;

the measurement circuit comprises at least one differential pair which comprises a first transistor on a first branch that is controlled using the top voltage and a second transistor on a second branch that is controlled using the bottom voltage;

a differential measurement signal comprises a component indicative of an output voltage on the first branch that is controlled using the top voltage and a component indicative of an output voltage on the second branch that is controlled using the bottom voltage of the at least one differential pair, the measurement circuit comprises an upper differential pair, which is arranged relative to a battery voltage used for operating the flying capacitor, and which is configured to provide an upper differential measurement signal;

the measurement circuit comprises a lower differential pair, which is arranged relative to a ground used tor operating the flying capacitor, and which is configured to provide a lower differential measurement signal;

the lower differential pair comprises a current source providing a bias current from a ground rail at the around;

the lower differential pair comprises a first NMOS transistor on the first branch which is controlled using the top voltage;

the lower differential pair comprises a second NMOS transistor on the second branch which is controlled using the bottom voltage;

the lower differential pair comprises a degeneration resistor arranged between a source of the first NMOS transistor and a source of the second NMOS transistor;

a second component of the lower differential measurement signal is provided at a drain of the first NMOS transistor; and a first component of the lower differential measurement signal is provided at a drain of the second NMOS transistor.

5. A detection circuit configured to detect a condition of a flying capacitor which is charged during a charging phase and discharged during a subsequent discharging phase; wherein the detection circuit comprises a timing circuit configured to set a detection trigger during the charging phase of the flying capacitor;

a measurement circuit configured to provide one or more differential measurement signals which are dependent on and/or indicative of a voltage across the flying capacitor at the detection trigger, and a comparator circuit configured to provide a digital output signal based on the one or more differential measurement signals: wherein the digital output signal is indicative of whether or not the flying capacitor is faulty;

wherein the living capacitor exhibits a top voltage at a top terminal and a bottom voltage at a bottom terminal of the flying capacitor;

during the charging phase the top voltage is higher than the bottom voltage in case of a non-faulty flying capacitor;

the measurement circuit is configured to provide the one or more differential measurement signals which are indicative of whether or not the top voltage is higher than the bottom voltage;

the measurement circuit comprises at least one differential pair which comprises a first transistor on a first branch that, is controlled using the top voltage and a second transistor on a second branch that is controlled using the bottom voltage;

a differential measurement signal comprises a component indicative of an output voltage on the first branch that is controlled using the top voltage and a component indicative of an output voltage on the second branch that is controlled using the bottom voltage of the at least one differential pair;

the measurement circuit comprises an upper differential pair which is arranged relative to a battery voltage used for operating the flying capacitor, and which is configured to provide an upper differential measurement signal;

the measurement circuit comprises a lower differential pair which is arranged relative to a ground used for operating the flying capacitor, and which is configured to provide a lower differential measurement signal;

the comparator circuit comprises a first combiner circuit configured to combine a first component of the upper differential measurement signal with a first component of the lower differential measurement signal, to provide a first combined component;

the comparator circuit comprises a second combiner circuit configured to combine a second component of the upper differential measurement signal with a second component of the lower differential measurement signal, to provide a second combined component; and the comparator circuit is configured to determine the digital output signal based on the first combined component and based on the second combined component.

6. The detection circuit of claim 5, wherein the first combiner circuit and/or the second combiner circuit each comprise a current mirror.

7. The detection circuit of claim 1, wherein a differential measurement signal which is provided by the measurement circuit comprises a first component and a second component;

the measurement circuit is configured to generate the differential measurement signal such that the first component is smaller than the second component, if the voltage across the flying capacitor is greater than a voltage threshold; or the first component is greater than the second component, if the voltage across the flying capacitor is greater than the voltage threshold; or the first component is greater than the second component, if the voltage across the flying capacitor is smaller than the voltage threshold; or the first component is smaller than the second component, if the voltage across the flying capacitor is smaller than the voltage threshold; and the comparator circuit is configured to compare the first component with the second component in order to determine the digital output signal.

8. The detection circuit of claim 7, wherein the comparator circuit comprises a first amplifier configured to amplify the first component of the differential measurement signal, to provide a first amplified component;

a second amplifier configured to amplify the second component of the differential measurement signal, to provide a second amplified component; and the comparator circuit is configured to compare the first amplified component with the second amplified component in order to determine the digital output signal.

9. The detection circuit of claim 8, wherein the comparator circuit comprises positive feedback circuitry configured to feedback a signal derived from the first component to the second amplifier; and/or feedback a signal derived from the second component to the first amplifier.

10. The detection circuit of claim 8, wherein the first amplifier and/or the second amplifier each comprise one or more NMOS or PMOS current mirrors.

11. The detection circuit of claim 1, wherein the timing circuit is configured to set the detection trigger such that in case of a non-faulty flying capacitor the voltage across the flying capacitor is at a minimum capacitor voltage or higher; and the minimum capacitor voltage is set to cause the measurement circuit to provide a differential measurement signal to indicate a non-faulty flying capacitor.

12. The detection circuit of claim 1, wherein the detection circuit comprises a register and/or memory configured to store the digital output signal.

13. The detection circuit of claim 1, wherein during the charging phase the flying capacitor is arranged between a supply voltage and an output voltage of a circuit comprising the flying capacitor; and the supply voltage is higher than the output voltage.

14. The detection circuit of claim 1, wherein the flying capacitor is part of an inductor-less DC/DC power converter configured to convert power from a supply voltage to an output voltage.

15. A control circuit for operating a flying capacitor; wherein the control circuit comprises one or more switches configured to operate the flying capacitor repeatedly in a charging phase and in a discharging phase;

the detection circuit according to claim 1, configured to determine a digital output signal during the charging phase, which is indicative of whether the flying capacitor is faulty or not; and a control unit configured to control the one or more switches in dependence of the digital output signal.

16. A method for detecting a condition of a flying capacitor which is charged during a charging phase and discharged during a subsequent discharging phase; wherein the method comprises setting a detection trigger during the charging phase of the flying capacitor;

providing, by a measurement circuit, one or more differential measurement signals which are dependent on and/or indicative of a voltage across the flying capacitor at the detection trigger; and providing a digital output signal based on the one or more differential measurement signals; wherein the digital output signal is indicative of whether or not the flying capacitor is faulty, wherein the flying capacitor exhibits a top voltage at a top terminal and a bottom voltage at a bottom terminal of the flying capacitor;

during the charging Phase the top voltage is higher then the bottom voltage in case of a non-faulty flying capacitor;

the measurement circuit provides the one or more differential measurement signals which are indicative of whether or not the top voltage is higher then the bottom voltage;

the measurement circuit comprises at least one differential pair which comprises a first transistor on a first branch that is controlled using the top voltage and a second transistor on a second branch that is controlled using the bottom voltage, a differential measurement signal comprises a component indicative of an output voltage on the first branch that Is controlled using the top voltage and a component indicative of an output voltage on the second branch that Is controlled using the bottom voltage of the at least one differential pair;

the measurement circuit comprises an upper differential pair which is arranged relative to a battery voltage used for operating the flying capacitor, and which provides an upper differential measurement signal;

the measurement circuit comprises a lower differential pair which is arranged relative to a ground used for operating the flying capacitor, and which provides a lower differential measurement signal;

the upper differential pair comprises a current source providing a bias current from a supply rail at the battery voltage;

the upper differential pair comprises a first PMOS transistor on the first branch which is controlled using the top voltage;

the upper differential pair comprises a second PMOS transistor on the second branch which is controlled using the bottom voltage;

the upper differential pair comprises a degeneration resistor arranged between a source of the first PMOS transistor and a source of the second PMOS transistor;

a first component of the upper differential measurement signal is provided at a drain of the first PMOS transistor; and a second component of the upper differential measurement signal is provided at a drain of the second PMOS transistor.

17. A control circuit for operating a flying capacitor; wherein the control circuit comprises one or more switches configured to operate the flying capacitor repeatedly in a charging phase and in a discharging phase;

the detection circuit according to claim 4, configured to determine a digital output signal during the charging phase, which is indicative of whether the flying capacitor is faulty or not; and a control unit configured to control the one or more switches in dependence of the digital output signal.

18. A control circuit for operating a flying capacitor; wherein the control circuit comprises one or more switches configured to operate the flying capacitor repeatedly in a charging phase and in a discharging phase;

the detection circuit according to claim 5, configured to determine a digital output signal during the charging phase, which is indicative of whether the flying capacitor is faulty or not; and a control unit configured to control the one or more switches in dependence of the digital output signal.

19. A method for detecting a condition of a flying capacitor which is charged during a charging phase and discharged during a subsequent discharging phase; wherein the method comprises setting a detection trigger during the charging phase of the flying capacitor;

providing, by a measurement circuit, one or more differential measurement signals which are dependent on and/or indicative of a voltage across the flying capacitor at the detection trigger; and providing a digital output signal based on the one or more differential measurement signals; wherein the digital output signal is indicative of whether or not the flying capacitor is faulty, wherein the flying capacitor exhibits a top voltage at a top terminal and a bottom voltage at a bottom terminal of the flying capacitor;

during the charging phase the top voltage is higher than the bottom voltage in case of a non-faulty flying capacitor;

the measurement circuit provides the one or more differential measurement signals which are indicative of whether or not the top voltage is higher than the bottom voltage;

the measurement circuit comprises at least one differential pair which comprises a first transistor on a first branch that is controlled using the top voltage and a second transistor on a second branch that is controlled using the bottom voltage;

a differential measurement signal comprises a component indicative of an output voltage on the first branch that is controlled using the top voltage and a component indicative of an output voltage on the second branch that is controlled using the bottom voltage of the at least one differential pair;

the measurement circuit comprises an upper differential pair, which is arranged relative to a battery voltage used for operating the flying capacitor, and which provides an upper differential measurement signal;

the measurement circuit comprises a lower differential pair, which is arranged relative to a ground used for operating the flying capacitor, and which provides a lower differential measurement signal;

the lower differential pair comprises a current source providing a bias current from a ground rail at the ground;

the lower differential pair comprises a first NMOS transistor on the first branch which is controlled using the top voltage;

the lower differential pair comprises a second NMOS transistor on the second branch which is controlled using the bottom voltage;

the lower differential pair comprises a degeneration resistor arranged between a source of the first NMOS transistor and a source of the second NMOS transistor;

a second component of the lower differential measurement signal is provided at a drain of the first NMOS transistor; and a first component of the lower differential measurement signal is provided at a drain of the second NMOS transistor.

20. A method for detecting a condition of a flying capacitor which is charged during a charging phase and discharged during a subsequent discharging phase; wherein the method comprises setting a detection trigger during the charging phase of the flying capacitor;

providing, by a measurement circuit, one or more differential measurement signals which are dependent on and/or indicative of a voltage across the flying capacitor at the detection trigger; and providing, by a comparator circuit, a digital output signal based on the one or more differential measurement signals; wherein the digital output signal is indicative of whether or not the flying capacitor is faulty, wherein the flying capacitor exhibits a top voltage at a top terminal and a bottom voltage at a bottom terminal of the flying capacitor;

during the charging phase the top voltage is higher than the bottom voltage in case of a non-faulty flying capacitor;

the measurement circuit provides the one or more differential measurement signals which are indicative of whether or not the top voltage is higher than the bottom voltage;

the measurement circuit comprises at least one differential pair which comprises a first transistor on a first branch that is controlled using the top voltage and a second transistor on a second branch that is controlled using the bottom voltage;

a differential measurement signal comprises a component indicative of an output voltage on the first branch that is controlled using the top voltage and a component indicative of an output voltage on the second branch that is controlled using the bottom voltage of the at least one differential pair;

the measurement circuit comprises an upper differential pair, which is arranged relative to a battery voltage used for operating the flying capacitor, and which provides an upper differential measurement signal;

the measurement circuit comprises a lower differential pair, which is arranged relative to a ground used for operating the flying capacitor, and which provides a lower differential measurement signal;

the comparator circuit comprises a first combiner circuit that combines a first component of the upper differential measurement signal with a first component of the lower differential measurement signal, to provide a first combined component;

the comparator circuit comprises a second combiner circuit that combines a second component of the upper differential measurement signal with a second component of the lower differential measurement signal, to provide a second combined component; and the comparator circuit determines the digital output signal based on the first combined component and based on the second combined component.

* * * * *